United States Patent [19]

Proskow

[11] 4,415,651

[45] Nov. 15, 1983

[54] AQUEOUS PROCESSABLE, POSITIVE-WORKING PHOTOPOLYMER COMPOSITIONS

[75] Inventor: Stephen Proskow, Wilmington, Del.

[73] Assignee: E. I. Du Pont de Nemours and Company, Wilmington, Del.

[21] Appl. No.: 335,051

[22] Filed: Jan. 4, 1982

Related U.S. Application Data

[63] Continuation-in-part of Ser. No. 271,411, Mar. 30, 1981, abandoned.

[51] Int. Cl.$^3$ ............................................. G03C 1/68
[52] U.S. Cl. ..................................... 430/277; 430/287; 430/326; 430/913; 204/159.18
[58] Field of Search ............... 430/286, 287, 277, 326, 430/913; 204/159.16, 159.17, 159.18, 159.2

[56] References Cited

U.S. PATENT DOCUMENTS

| | | | |
|---|---|---|---|
| 2,589,151 | 3/1952 | Serniuk | 260/79.5 |
| 3,627,529 | 12/1971 | Frank et al. | 96/33 |
| 3,660,088 | 5/1972 | Lundsager | 96/36 |
| 3,767,398 | 10/1973 | Morgan | 96/36.2 |
| 3,809,633 | 5/1974 | Magnotta et al. | 204/159.14 |
| 3,936,530 | 2/1976 | Morgan | 427/43 |
| 4,130,469 | 12/1978 | McGinniss | 204/159.16 |
| 4,179,295 | 12/1979 | Takamizawa et al. | 428/447 |
| 4,179,531 | 12/1979 | Hein et al. | 430/286 |
| 4,234,676 | 11/1980 | Hein et al. | 430/286 |
| 4,248,960 | 2/1981 | Hein et al. | 430/286 |
| 4,266,004 | 5/1981 | Kern | 430/269 |

FOREIGN PATENT DOCUMENTS

1179252 1/1970 United Kingdom .
1390711 4/1975 United Kingdom .

OTHER PUBLICATIONS

Serniuk et al., J. Am. Chem. Soc., 70, pp. 1804 to 1808 (1948).
Marvel et al., Ind. Eng. Chem., 45, pp. 2090 to 2093 (1953).
Merrill et al., Research Disclosure, 143, p. 24 (1976).

Primary Examiner—J. Travis Brown
Attorney, Agent, or Firm—James A. Costello

[57] ABSTRACT

Three-component aqueous processable, positive-working photopolymer compositions comprising (i) an unsaturated polymer, (ii) a reactive mercapto acid and (iii) a radiation-sensitive, radical-generating initiator; substrates coated with such compositions; and a photoimaging process.

27 Claims, No Drawings

AQUEOUS PROCESSABLE, POSITIVE-WORKING PHOTOPOLYMER COMPOSITIONS

CROSS-REFERENCE TO RELATED APPLICATION

This is a continuation-in-part of copending patent application bearing U.S. Ser. No. 271,411 filed on Mar. 30, 1981, now abandoned.

BACKGROUND OF THE INVENTION

This invention relates to photosensitive compositions containing an unsaturated polymer, a mercapto acid and a radical initiating system; to elements made from said compositions; and to a process for photoimaging said elements.

Background publications include the following items:

U.S. Pat. No. 4,179,531 discloses a curable composition conprising a monoalkenyl aromatic-diene copolymer resin, a monomer containing a photo-cross-linkable C=C, a polythiol, and a photoinitiator;

U.S. Pat. No. 4,234,676 discloses a curable composition containing an unsaturated polymer, a monomer, a thiol, and a curing agent;

U.S. Pat. No. 4,248,960 discloses a relief-producing laminate, the under-lamina composition being preferably a photocurable polymer composition;

U.S. Pat. No. 4,266,004 discloses the photoimaging of selected organic sulfide-containing polymers in the presence of oxygen and a photosensitizer;

British Pat. No. 1,390,711 and U.S. Pat. No. 3,767,398 disclose a curable composition consisting of a polymer with recurring units of the monoallyl ester of a methyl vinyl ether/maleic anhydride interpolymer and a polythiol, with or without a photocuring rate accelerator;

U.S. Pat. No. 3,809,633 discloses a chain-extended polythioether-containing polymer composition having reactive unsaturated carbon-carbon functional groups and/or reactive thiol groups within the molecule;

U.S. Pat. No. 3,660,088 discloses a process for etching metal employing a photocurable composition consisting of a polyene, a polythiol, and a photocuring rate accelerator;

U.S. Pat. No. 3,936,530 discloses a curable coating composition which consists of a styrene-allyl alcohol copolymer-based polyene and a polythiol component;

U.S. Pat. No. 3,627,529 discloses a process for preparing a lithographic printing plate from a photocurable composition of an ethylenically unsaturated polyene, a polythiol, and a photocurable rate accelerator;

U.S. Pat. No. 4,179,295 discloses a photosensitive composition containing an organopolysiloxane with aliphatically unsaturated linkages in the molecule and a mercapto-containing organopolysiloxane, the organopolysiloxane cured by irradiation with ultraviolet light to effect cross-linking;

U.S. Pat. No. 4,130,469 discloses a curable coating composition which contains a polymer with pendant mercaptan groups and a bis-maleimide cross-linking agent;

British Pat. No. 1,179,252 discloses the use of butadiene polymers containing carboxyl groups in the preparation of thermoplastic elastomer compositions;

U.S. Pat. No. 2,589,151 discloses thioglycolic acid adducts of butadiene copolymers, prepared in solution using a free-radical initiator; adduct structures being further discussed by Serniuk et al. in *J. Am. Chem. Soc.*, 70, pages 1804 to 1808 (1948);

Marvel et al., *Ind. Eng. Chem.*, 45, pages 2090 to 2093 (1953), disclose the modification of polybutadiene by addition of thiols containing polar groups such as mercaptoacetic acid, to give polymers with improved oil resistance;

Merrill et al., *Research Disclosure*, 143, page 24 (1976), disclose the use of mercapto acid derivatives of unsaturated polymers as a component in liquid electrographic developers.

SUMMARY OF THE INVENTION

This invention concerns a photosensitive composition comprising the following components:

(i) about 10 to 90 percent by total weight of components (i), (ii), and (iii), of a polyene having a number average molecular weight of about 1,000 to 1,000,000, said polyene containing about 20 to 1800 milliequivalents of reactive unsaturated carbon to carbon groups per 100 g of polyene;

(ii) about 1 to 70 percent by total weight of components (i), (ii), and (iii), of a reactive mercapto acid; and (iii) about 0.001 to 50 percent by total weight of components (i), (ii), and (iii) of a radiation-sensitive, radical-generating system, activatable by actinic radiation to initiate addition of the mercapto acid to the polyene.

This invention also concerns a photosensitive element which comprises a sustrate coated with a layer of the photosensitive composition having a thickness in the range of about 0.1 μm to 7,600 μm or more. The preferred photosensitive elements are used as photoresists and proofing systems. The substrate can be any natural or synthetic support, preferably one capable of existing in flexible or rigid film or sheet form.

This invention also concerns a method of photoimaging which comprises imagewise exposing a photosensitive element to actinic radiation containing wavelengths of 2,000 to 5,000 Å through an image-bearing transparency, and developing the image.

The term "reactive" unsaturated carbon to carbon groups means groups which react under actinic radiation, in the presence of a photosensitizer, with the thiol group of a mercapto acid to yield the thioether linkage,

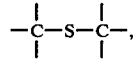

as contrasted with the "unreactive" groups,

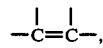

found in aromatic nucleii such as cyclic structures exemplified by benzene, pyridine, naphthalene, and the like, which do not under the same conditions react with the thiol group to give thioether linkages.

The term "unsaturated carbon to carbon groups" means:

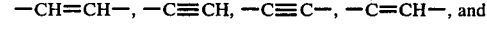

$$-CH=CH_2 \quad -\overset{|}{C}=CH_2$$

The polyene can contain one type of such unsaturated group or it can contain two or more such types. The groups can be isolated or conjugated with each other, e.g., a 1,3-diene, or conjugated with adjacent unreactive groups such as $$-\overset{|}{C}=\overset{|}{C}-,$$

carbonyl, sulfonyl, phosphonyl, and the like.

The polyene, component (i) of the photosensitive composition, has a preferred number average molecular weight of about 5,000 to 100,000 and a preferred degree of unsaturation of about 50 to 1,000 milliequivalents of reactive unsaturated carbon to carbon groups per 100 grams of polyene. Preferred quantities of polyene are about 40 to 80 percent of the total weight of components (i), (ii), and (iii).

It is preferred that the reactive unsaturated carbon to carbon groups of the polyene be located within the main polymer chain, terminally, near terminally and/or pendant from the main polymer chain. The term "terminal" means that the reactive group is at the end of the main chain in the molecule, whereas "near terminal" means that the reactive group is not more than 16 carbon atoms away from an end of the main chain in the molecule. The term "pendant" means that the reactive group is located terminally or near terminally in a branch of the main chain as contrasted to a position at or near the end of the main chain. For purposes of brevity and convenience, unsaturation at any of these positions is referred to herein as "terminal" unsaturation.

Preferred polyenes contain at least one group selected from $$-\overset{|}{C}=CH_2,$$

—CH=CH—, and —CH=CH$_2$ because of their high reactivity. Particularly preferred are polyenes which contain such groups in the alkyl portion of a substituted alkyl methacrylate copolymer. Preferred polyenes include copolymers of methyl methacrylate with allyl methacrylate or undecenyl methacrylate; and terpolymers of methyl methacrylate, butyl methacrylate, and allyl methacrylate.

The preferred mercapto acids are mercaptocarboxylic acids. Preferably, the mercapto acid is present in an amount from about 5 to 40 percent by total weight of components (i), (ii), and (iii). The radical-generating system is preferably present at about 1 to 20 percent by total weight of components (i), (ii), and (iii). The preferred radical-generating system comprises benzoin ethers, especially benzil dimethyl ketal.

For high quality imaging applications, it has been found most beneficial to employ photosensitive elements that contain photosensitive layers having about 10% to 100% of the photosensitive composition described herein. The balance of the photosensitive layer, up to 90% by total weight of the layer, can be comprised of materials added to improve physical properties without contributing to photosensitivity.

The photosensitive compositions of this invention have utility in lithographic printing, gravure images, preparation of printing plates for offset and letter press, engineering drafting films, photoresists in making printed circuits or in chemical milling, solder masks, flexographic printing, vesicular images, microimages for information storage, and decoration of paper, glass, and metal packages. Other specific uses will be evident to those skilled in the art. Because the compositions are single-exposure, monomer-free, and positive-working using aqueous solvent washout development, they are particularly useful in positive-working photoresist applications.

DETAILS OF THE INVENTION

Polyenes (i)

Examples of suitable polyenes with pendant unsaturation include substituted alkyl acrylate and alkyl methacrylate copolymers such as copolymers of methyl methacrylate and terpolymers of methyl methacrylate and butyl methacrylate with unsaturated monomers such as undecenyl methacrylate, allyl methacrylate, crotyl methacrylate, allyloxyethyl methacrylate, cinnamyl methacrylate, 2,4-pentadienyl methacrylate, diallylaminoethyl methacrylate, trimethylolpropane diallyl ether methacrylate, vinyl methacrylate, 2,5-cyclohexadienylmethyl methacrylate, allyl alcohol esters and allylamine amides of maleic anhydride copolymers, 1-butynyl methacrylate and 2-butynyl methacrylate.

Other suitable polyenes include those unsaturated polymers in which the double or triple bonds occur primarily within the main chain of the molecule, such as the conventional elastomers: polyisoprene, cyclized rubber, polybutadiene, styrene-butadiene rubber, isobutylene-isoprene rubber, styrene-butadiene-acrylonitrile rubber, ethylene-propylene-nonconjugated diene terpolymers, and the like. Unsaturated polyesters, polyamides, and polyurethanes are also suitable.

Another group of suitable polyenes includes those in which the reactive unsaturated carbon to carbon groups are conjugated with adjacent unreactive groups; for example, polyvinyl cinnamate and resins which contain pendant acrylate groups such as those prepared by reaction of acrylic acid with extralinear glycidyl ester groups attached to a vinyl addition polymer, as more particularly described in U.S. Pat. No. 3,418,295.

Mercapto Acids (ii)

The contemplated mercapto acids are those that contain a single thiol, —SH, functional group. Suitable mercapto acids include mercaptocarboxylic acids, mercaptosulfonic acids, mercaptophosphonic acids, and mercaptophenols. Particularly preferred mercaptocarboxylic acids are those of the structure $$HS-R-CO_2-H$$

wherein R is alkylene of 1 to 18 carbons, unsubstituted, or substituted with carboxyl or $C_1$ to $C_6$ alkoxycarbonyl groups.

Suitable mercapto acids are:
Mercaptoacetic acid
3-Mercaptopropionic acid
2-Mercaptopropionic acid
Mercaptosuccinic acid
6-Mercaptocaproic acid
Mercaptoitaconic acid 2-Mercaptocaproic acid
4-Mercaptomethylbenzoic acid
4-Mercaptomethylphenylpropionic acid
11-Mercaptoundecanoic acid
9-Mercaptostearic acid
Mercaptododecylsuccinic acid
2-Mercaptoethanesulfonic acid
3-Mercaptopropanesulfonic acid
4-Mercaptobutanesulfonic acid
Mercaptomethylphosphonic acid
2-(2-Mercaptoethyl)phenol
2-(3-Mercaptopropyl)phenol
Mercaptosuccinic acid, monomethyl ester
Mercaptosuccinic acid, mono-n-hexyl ester
Mercaptosuccinic acid, mono-2-ethoxyethyl ester
N-Acetylcysteine
12-Mercaptododecanoic acid.

Radical-Generating System (iii)

Practically any radiation-sensitive, radical-generating system which initiates addition of the mercapto acid to the reactive unsaturated carbon to carbon groups of the polyene is suitable for use in the photosensitive composition of this invention. Because process transparencies transmit heat originating from conventional sources of actinic radiation the preferred radical generating compounds are inactive thermally below about 85° C., and more preferably below about 185° C. They should be dispersible in the composition to the extent necessary for initiating the desired mercapto acid addition under the influence of the amount of radiation absorbed in relatively short term exposures.

The radical-generating system absorbs radiation of about 2,000 to 5,000 Å and has at least one component that has an active radiation absorption band with a molar extinction coefficient of at least about 50 within the range of about 2,000 to 5,000 Å. The term "active radiation absorption band" means a band of radiation which is active to produce the radicals necessary to initiate addition of the mercapto acid to the reactive unsaturated carbon to carbon groups of the polyene. The radical-generating system can be composed of one or more compounds which furnish radicals directly when subject to radiation. Alternatively, the system can contain sensitizers together with compounds which yield radicals after having been caused to do so by the radiation-activatable sensitizer(s).

A large number of radical-generating compounds can be utilized in the practice of the invention, including: aromatic ketones such as benzophenone, Michler's ketone [4,4'-bis(dimethylamino)benzophenone], 4,4'-bis(diethylamino)benzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, desoxybenzoin, and other aromatic ketones; benzoin, benzoin ethers such as benzoin methyl ether, methylbenzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl)-4,5-di-(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, and 2-(p-methylmercaptophenyl)-4,5-diphenylimidazolyl dimer.

Other useful 2,4,5-triarylimidazolyl dimer radical generating systems are disclosed in U.S. Pat. Nos. 3,479,185 and 3,784,557, and in British Pat. Nos. 997,396 and 1,047,569.

The imidazolyl dimers listed above can be used with a radical-producing sensitizer such as 2-mercaptobenzoxazole, Leuco Crystal Violet or tris(4-diethylamino-2-methylphenyl)methane. Such sensitizers as Michler's ketone can also be employed therewith as can energy transfer dyes such as Rose Bengal and Eosin Y.

Other useful radical-generating systems comprise cyclohexadienone compounds such as 4-methyl-4-trichloromethyl-2,5-cyclohexadienone, 3,4-dimethyl-4-trichloromethyl-2,5-cyclohexadienone, 4-dichloromethyl-4-methyl-2,5-cyclohexadienone, 2,6-di(tert-butyl)-4-methyl-4-trichloromethyl-2,5-cyclohexadienone, and other 2,5-cyclohexadienones which contain a trichloromethyl group and an alkyl or aryl group at the 4-position. Such cyclohexadienones can be used with a sensitizer such as Michler's ketone.

Additive Materials

Materials that can be included with the photosensitive composition in the element's photosensitive layer include polymeric binder(s) which serve to strengthen the composition or adhere it to a substrate. Radiation-transparent and film-forming polymers are preferred. Examples of suitable binders are thermoplastic macromolecular organic polymers which have number average molecular weights of at least about 1500, preferably at least 4000, including such polymer types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) synthetic rubbers; (g) cellulose esters; (h) polyvinyl esters including polyvinyl acetate/acrylate and polyvinyl acetate/methacrylate copolymers; (i) polyacrylate and α-alkylpolyacrylate esters, e.g., polymethyl methacrylate, polyethyl methacrylate, and methyl methacrylate/ethyl acrylate copolymers; (j) high molecular weight polyethylene oxides of polyglycols having average molecular weights of about 4000 to 1,000,000; (k) polyvinyl chloride and copolymers; (l) polyvinyl acetal; (m) polyurethanes; (n) polycarbonates; (o) polystyrenes; and the like.

If desired, the photosensitive composition can also contain immiscible polymeric or nonpolymeric organic fillers or reinforcing agents which are essentially transparent at the wavelengths used for the exposure, e.g., the organophilic silicas, bentonites, silica, powdered glass and colloidal carbon, as well as various types of pigments. Such materials are used in amounts varying with the desired properties of the photosensitive composition. The fillers are useful in improving the strength of the composition, reducing tack, and, in addition, as coloring agents. Additives which can be employed include dyes, colorants, pigments, dispersing agents, thermographic compounds, and the like.

With certain polyenes, it may be desirable to add a plasticizer to give flexibility to the resulting photosensitive layer and facilitate selective development. Suitable plasticizers include dialkyl phthalates, polyethylene glycols and related materials such as substituted phenol-/ethylene oxide adducts, e.g., the polyethers obtained from o-, m-, and p-cresol, o-, m-, and p-phenylphenol and p-nonylphenol, including commercially available materials such as the alkyl phenoxypolyoxyethylene ethanols. Other plasticizers include the acetates, propionates, butyrates, caprylates and other carboxylate esters of ethylene glycol, diethylene glycol, glycerol, triethylene glycol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate.

In order to prevent premature radical reactions prior to use, there can be incorporated in the photosensitive composition a minor amount, for example, about 0.001 to 2 percent, based on the total photosensitive composition, of a stabilizer such as hydroquinone, tertiary-butyl catechol, 4-methyl-2,6-di-t-butylphenol, the nitroso dimer inhibitor systems of U.S. Pat. No. 4,168,982, the bis(substituted amino)sulfides of U.S. Pat. No. 4,168,981, the nitroaromatic photoinhibitors of U.S. Pat. No. 4,198,242, and the like. Such stabilizers improve the storage stability of the photosensitive elements by preventing thermal oxidation or reaction induced by exposure to adventitious radiation.

Photosensitive Element

Suitable substrates which, together with the photosensitive composition coated thereon, form the photosensitive elements of this invention include glass, a metal sheet or foil such as copper, aluminum, or stainless steel; a sheet or film of synthetic organic resin; cellulose paper; fiberboard; or a composite of two or more of these materials. Additional substrates include wood, cloth, silicon wafers, and cellulose esters such as cellulose acetate, cellulose propionate, cellulose butyrate, and the like. Also suitable are films or plates composed of various film-forming synthetic resins or high polymers, such as the addition polymers, in particular the vinylidene polymers such as vinyl chloride polymers, vinylidene chloride copolymers with vinyl chloride, vinyl acetate, styrene, isobutylene, and acrylonitrile; vinyl chloride copolymers with the latter polymerizable monomers; linear condensation polymers including polyesters such as polyethylene terephthalate; polyamides such as polyhexamethylene sebacamide; polyester amides such as polyhexamethylene adipamide/adipate, and the like.

Preferred substrates are thin and flexible grained aluminum sheets, steel sheets, copper sheets, silicon wafers, oriented polyethylene terephthalate film, polyvinylidene chloride copolymer-coated oriented polyester film, and gelatin-coated oriented polyester film. The particular substrate will generally be determined by the use application involved. For example, the photosensitive compositions of this invention are particularly useful for the preparation of photoresists when a copper substrate is used.

Fillers or reinforcing agents can be present in the sythetic resin or polymer bases, including synthetic, modified or natural fibers such as cellulosics like cotton, cellulose acetate, viscose rayon and paper. Also useful are glass wool, nylon, and the like. These reinforced bases can be used in laminated form.

The photosensitive element can have antihalation material beneath the photosensitive layer. For instance, the substrate can contain an antihalation material or have a layer or stratum of such material on its surface. The antihalation layer intermediate between the photosensitive layer and the substrate when used must have adequate adhesion to the substrate and the photosensitive layer and not react with the radiation-adsorptive material. Antihalation pigments include carbon black, manganese dioxide, Acid Blue Black and Acid Magenta O. Resin carriers for the antihalation materials can be polymers of vinyl compounds including copolymers of acrylic and methacrylic acid, polyvinyl chloride polymers and copolymers with vinyl acetate, diethyl fumarate, ethyl acrylate and the like.

The photosensitive compositions of this invention provide photosensitive elements which have a high resistance to oxygen inhibition of the photo reaction. As a result of this phenomenon in combination with the high photospeed, satisfactory images can often be obtained by exposure of the element to radiation in the presence of air. Nevertheless, it is sometimes desirable to carry out imaging in vacuum or to use a topcoat or protective stratum for the element. Such topcoats should be transparent to actinic radiation, substantially impermeable to oxygen and preferably permeable to water. Suitable coatings include, for instance, polyvinyl alcohol, polyvinyl acetate, gelatin, gum arabic, methyl vinyl ether/maleic anhydride copolymer, ethylene oxide polymer, and polyvinyl pyrrolidone, as more particularly described in one or more of: U.S. Pat. No. 3,458,311 and British Pat. Nos. 1,148,362 and 1,303,578.

The photosensitive composition is usually applied to the substrate as a solution or dispersion in a carrier solvent. The solution or dispersion can be sprayed, brushed, applied by a roller or an immersion coater, flowed over the surface, picked up by immersion or applied to the substrate by other suitable means. The solvent is then allowed to evaporate. In general, solvents are employed which are volatile at ordinary pressures. Suitable solvents include amides such as N,N-dimethylformamide and N,N-dimethylacetamide; alcohols and ether alcohols such as methanol, ethanol, 1-propanol, 2-propanol, butanol, ethylene glycol, 1,2-dimethoxyethane, 2-butoxyethanol, and 2-ethoxyethanol; esters such as methyl acetate and ethyl acetate; aromatic hydrocarbons and aromatic halocarbons such as benzene, o-dichlorobenzene and toluene; ketones such as acetone, 2-butanone, and 3-pentanone; aliphatic halocarbons such as 1,1,1-trichloroethane, methylene chloride, chloroform, 1,1,2-trichloroethane, 1,1,2,2-tetrachloroethane, 1,1,2-trichloroethylene; miscellaneous solvents such as dimethyl sulfoxide, pyridine, tetrahydrofuran, dioxane, dicyanocyclobutane, N-methylpyrrolidone; and mixtures of these solvents in various proportions as required to attain solutions.

Photoimaging Process

The photosensitive compositions and elements of this invention are exposed imagewise to actinic radiation. Exposure is preferably through an image-bearing transparency. Suitable sources of radiation include ordinary sunlight and artificial sources such as sunlamps, pulsed and continuous xenon flash lamps, tungsten-halogen lamps, germicidal lamps, ultraviolet lamps providing specifically radiation of short wavelength (2537 Å), and lamps providing radiation of longer wavelengths, narrow or broad band, centered near 3600 Å, 4200 Å, 4500 Å, or 5000 Å, such as fluorescent lamps, mercury, metal additive, and arc lamps. Argon glow lamps, photographic flood lamps, lasers and fluorescent radiation sources such as the tracings on the face of a cathode ray tube may also be used. Electron accelerators and electron beam sources through an appropriate mask are also suitable. Of these, the mercury-vapor lamps, particularly the sun lamp or "black light" type, the fluorescent sun lamps, the xenon flash lamps, and the tungsten-halogen lamps are the most preferred.

The radiation exposure times can vary from fractions of a second to minutes depending upon the intensity and spectral energy distribution of the radiation used, its distance from the photosensitive layer, and the nature and amounts of the photosensitive components in the layer. Customarily, a distance of about 1.5 to 60 inches (3.8 to 153 cm) from the photopolymerizable layer is used. Exposure temperatures are not particularly critical, but it is preferred to operate at about ambient temperatures or slightly higher, i.e., about 20° to 50° C.

Imagewise exposure is conveniently carried out by exposing the photopolymerizable element to actinic radiation through a process transparency, that is, an image-bearing transparency consisting of areas substantially opaque and substantially transparent to the radiation being used, where the opaque areas can be substantially of the same optical density; for example, a so-called line or halftone negative or positive. Suitable process transparencies also include those with a graded range of opaque areas; for example, a continuous tone negative. Process transparencies can be constructed of any suitable materials including cellulose acetate film and polyester film.

After exposure, the image is developed. Development can be by toning, i.e., dusting with a fine pigment which selectively adheres to the tacky areas, by dye imbibition or by modulation of diffusion. Generally, however, the portions of the layer corresponding to the exposed portions are removed, e.g., in photoresist applications. This latter method of development can be achieved by pressure transfer, differential adhesion of the exposed versus unexposed areas, use of peel apart transfer, and, preferably, by solvent washout. The solvent liquid used for development should have good solvent action in the exposed acidic portion of the composition, and little action in the unexposed area in the time required to remove the exposed portion.

It is preferred to employ as development solvents an aqueous base or an aqueous base to which a water-soluble organic solvent is added. Suitable solvent mixtures include sodium hydroxide/isopropyl alcohol/water, sodium carbonate/water, sodium carbonate/2-butoxyethanol/water, sodium borate/2-butoxyethanol/water, sodium silicate/2-butoxyethanol/glycerol/water, and sodium carbonate/2-(2-butoxyethoxy)ethanol/water. The particular solvent combination chosen will depend upon the physical properties and carboxyl content of the exposed polyene.

Solvent development can be carried out at about 25° C., but best results are obtained when the solvent is at 30° to 60° C. Development time can be varied and usually is about 1 to 15 minutes. In the development step where the image is formed, the solvent can be applied in any convenient manner, as by pouring, immersion, spraying, or roller application. Spraying is preferred since it aids in the removal of the exposed portions of the composition.

Exposure of a photosensitive composition of the invention to actinic radiation causes addition of the mercapto group of the mercapto acid to reactive unsaturated carbon to carbon groups of the polyene in the exposed area to give a modified polymer which contains acid groups. Development, for example by solvent washout with aqueous alkali, provides for ready dissolution of the acid-containing polymer to give directly a positive image where the solubilized area corresponds to the exposed area. The photosensitive elements of the invention show good photochemical efficiency (good imaging speed).

EXAMPLES

The following are illustrative Examples of the invention in which all parts and percentages are by weight and all degrees are Celsius unless otherwise stated. Many of the unsaturated polymers employed as polyenes in the Examples were prepared by anionic copolymerization of the monomers by either Procedure A or Procedure B. Examples 10, 50, 53, and 56 represent preferred embodiments.

Procedure A

A 45:45:10 random copolymer of methyl methacrylate/n-butyl methacrylate/cinnamyl methacrylate was prepared by the following procedure.

All glassware for this polymerization was ovendried at 150° for four hours prior to use. The apparatus was assembled while hot, flushed with argon until cool, and the reaction was conducted under a positive pressure of argon. The tetrahydrofuran (THF) was freshly distilled from benzophenone/sodium under nitrogen. Freshly distilled cinnamyl methacrylate (bp 79° to 80°/0.005 mm, 5.06 g, 25 mmol), n-butyl methacrylate (16.00 g, 112 mmol), and methyl methacrylate (11.26 g, 112 mmol) were mixed, filtered through neutral alumina, and degassed with argon for 15 min. Separately, a 250 ml, 4-necked flask equipped with a glass mechaical stirrer, thermometer probe, rubber serum cap, and argon inlet was charged with THF (300 ml) and diphenylethylene (redistilled, bp 90°/1 mm, 0.44 g, 2.5 mmol). The solution was cooled to 0° and n-butyl lithium (1.6 M in hexane, 1.7 ml, 2.5 mmol) was added. The blood-red solution was cooled to $-78°$ and the monomer mixture (25.9 g, 0.2 mol) was added at such a rate that the temperature did not exceed $-70°$ (10 min). After 15 min, acetic acid (0.2 ml, 3 mmol) was added and the warmed solution was poured into water (2 l). The granular solid copolymer was isolated and dried in a vacuum dessicator overnight to give the cinnamyl methacrylate copolymer (25.8 g, 100%) as a fine white powder. The 90 MHZ $^1$H NMR spectrum showed, among others, bands at 4.5 (broad d, J about 6, OC$\underline{H}_2$—CHC$_6$H$_5$), 3.8 (broad t, J about 6, OC$\underline{H}_2$CH$_2$CH$_2$CH$_3$), and 3.5 (s, OCH$_3$) in a 3:15:21 ratio which corresponds to a composition of 9% cinnamyl-, 47% butyl-, and 44% methyl methacrylate in the copolymer. Gel Permeation Chromatography (GPC); $\overline{M}_n$ 9,700, $\overline{M}_w$ 10,000; $T_g$ by Differential Scanning Calorimetry (DSC) 54°.

Procedure B

A 40:40:20 random copolymer of methyl methacrylate/butyl methacrylate/allyl methacrylate was prepared by the following procedure.

All glassware and reagents were prepared as in Procedure A. Allyl methacrylate (15.14 g, 0.12 mol), butyl methacrylate (34.13 g, 0.24 mol) and methyl methacrylate (24.03 g, 0.24 mol) were mixed, filtered through alumina (10 g) and degassed with argon. A 500 ml flask equipped as in Procedure A was charged with THF (300 ml) and potassium t-butoxide (5.61 g, 0.05 mol). The monomer mixture (61.1 g, 0.5 mol) was added dropwise over 23 min. The temperature rose from 25° to 53° over this period and then dropped back to 25°. Acetic acid (4 ml, 70 mmol) was added, and the reaction mixture was poured into water (4 l) in a blender. The isolated copolymer was dried in a vacuum dessicator to give the allyl methacrylate copolymer (59 g, 97%) as a fine white powder. NMR analysis showed the copolymer composition to be 21% allyl-, 44% butyl-, and 35% methyl methacrylate. GPC; $\overline{M}_n$ 6,000, $\overline{M}_w$ 10,000.

Other unsaturated copolymers prepared by Procedures A and B are listed in Table 1, wherein MMA is methyl methacrylate and BMA is n-butyl methacrylate.

TABLE 1

| Copolymer Designation | Copolymer Composition | Preparative Procedure | $\overline{M}_n$ (obs) |
|---|---|---|---|
| A | 45:45:10 MMA/BMA/cinnamyl methacrylate | A | 9,700 |
| B | 40:40:20 MMA/BMA/allyl methacrylate | B | 6,000 |
| C | 80:20 MMA/undecenyl methacrylate | A | 11,000 |
| D | 90:10 MMA/allyl methacrylate | B | 15,000 |
| E | 45:45:10 MMA/BMA trimethylolpropane diallyl ether methacrylate | A | 11,000 |
| F | 45:45:10 MMA/BMA/allyloxyethyl methacrylate | A | 11,000 |
| G | 45:45:10 MMA/BMA/diallylaminoethyl methacrylate | A | 8,700 |
| H | 80:20 MMA/vinyl methacrylate | A | 3,500 |
| I | 45:45:10 MMA/BMA/crotyl methacrylate | A | 11,000 |
| J | 45:45:10 MMA/BMA/2,5-cyclohexadienylmethyl methacrylate | A | 8,300 |
| K | 80:20 MMA/undecenyl methacrylate | B | 13,000 |
| L | 80:20 MMA/allyl methacrylate | B | 9,100 |
| M | 90:10 MMA/allyl methacrylate | B | 9,500 |
| N | 40:40:20 MMA/BMA/allyl methacrylate | B | 9,700 |
| O | 45:45:10 MMA/BMA/allyloxyethyl methacrylate | A | 5,900 |
| P | 45:45:10 MMA/BMA/2-butynyl methacrylate | A | 8,300 |
| Q | 40:40:20 MMA/BMA/allyloxyethyl methacrylate | B | 8,600 |
| R | 40:40:20 MMA/BMA/allyl methacrylate | B[(1)] | 14,000 |
| S | 40:40:20 MMA/BMA/allyl methacrylate | B | 5,100 |

[(1)]The monomer mixture was added to the initiator solution at 0°, and the reaction mixture was allowed to warm up as polymerization proceeded.

EXAMPLE 1

A 20 percent solids coating solution of the photosensitive composition was prepared by mixing the following ingredients:
1.00 g of copolymer M
0.150 g of mercaptosuccinic acid
0.100 g of ethylene glycol dicaprylate plasticizer.
0.072 g of benzophenone radical-generator
0.010 g of 4-methyl-2,6-di-t-butylphenol inhibitor
5.328 g of 95/5 methylene chloride/methanol solvent.

The solution was coated onto a freshly pumiced blank copper laminate board with an 8-mil (200-μm) doctor knife. The coated board was dried in air at room temperature to give a clear, smooth, nontacky film approximately 25 μm in thickness. The coated board was exposed imagewise for 8 min in a glass vacuum frame (nuArc Co., Inc.) at about 250 mm mercury pressure to an Ultraviolet Products, Inc. exposure source, Model B-100 A/X, containing a 100 W lamp (Sylvania flood lamp H-44-JM-100). The lamp was operated without the infrared filter at a distance of 7 inches (17.8 cm) from the board. The process transparency was held in direct contact with the board during exposure. After exposure, the board was developed at room temperature by immersing it in a solution of 0.5 percent sodium hydroxide in water/isopropyl alcohol (approx. 1/1) and gently brushing the surface with a soft brush. The film was dissolved rapidly in the exposed areas of the board. Development was stopped by rinsing with water when the image was completely developed to the copper surface of the board. The positive image was well-defined.

When the exposure time was increased to 12 min, a clear, sharp image which corresponded precisely to the transparent image of the process transparency was delineated on the copper surface. In this experiment, development was carried out at 35° with a solution of 0.8 percent sodium carbonate in approximately 4.5/1 water/2-(2-butoxyethoxy)-ethanol solvent mixture.

EXAMPLE 2

A coating solution, prepared as described in Example 1, was coated onto a freshly pumiced blank copper laminate board with a 5-mil (125-μm) doctor knife. The coated board was dried and portions of the board were exposed through a process transparency as described. After exposure, the boards were developed for varying times at 30° to 35° in a solution of 0.8 percent sodium carbonate in 9/1 water/2-(2-butoxyethoxy)ethanol with agitation by means of a magnetic stirrer. The results are summarized in Table 2.

TABLE 2

| Exposure Time, min | Development Time, min | Image Quality |
|---|---|---|
| 6 | 5 | Partially developed |
| 12 | 3 | Completely developed, sharp image |
| 18 | 2 | Completely developed, sharp image |

Another portion of the coated board was exposed for 12 min under glass in the vacuum frame at atmospheric pressure. The image developed completely with a 4-minute development time.

Another portion of the coated board was exposed for 12 min in air, and a completely developed image was obtained with a 2-minute development time. Thus, oxygen does not appreciably affect the photospeed of the photosensitive composition. This developed board was baked for 30 min at 106° in a circulating air oven, and it was subsequently etched in a standard ferric chloride TABLE 6-continued

| Example | Exposure Time, min | Development Time, min |
|---------|--------------------|-----------------------|
| 9 | 1.0 | 2.5 |

The developed film of Example 9 was very soft and it flowed gradually into the developed areas on standing.

EXAMPLE 10

A coating solution of the photosensitive composition was prepared as follows:
 1.00 g of copolymer L
 0.134 g of mercaptosuccinic acid
 0.140 g of ethylene glycol dicaprylate
 0.054 g of benzil dimethyl ketal
 0.002 g of 4-methyl-2,6-di-t-butylphenol
 0.003 g of benzotriazole
 5.332 g of 90/10 methylene chloride/methanol solvent.

The quantity of mercaptosuccinic acid used corresponds to about 0.56 mole per mole of carbon-carbon double bond in the copolymer. The solution was coated onto a freshly pumiced, blank copper laminate board with an 8-mil (200-μm) doctor knife, and the board was dried. A polypropylene cover sheet was applied to the coating, and samples of the board were exposed imagewise through the cover sheet as described in Example 1. After exposure, the boards were developed for varying times at 32° in a solution of 0.8 percent sodium carbonate in 9/1 water/2-(2-butoxyethoxy)ethanol with agitation by means of a magnetic stirrer. Sharp, completely developed images were obtained at exposure times of 0.5 to 2 min and development times of 2.5 to 5 min. The unexposed, undeveloped areas were nontacky and not visibly affected by the developer solution.

A sample board which was exposed imagewise for 1 min and developed for 2.5 min was dried for 2 hrs at room temperature and then reexposed through a polypropylene cover sheet without the process transparency. The blanket exposure caused the nonimaged area to strip readily from the board after 2.5 min in the developer solution. In contrast, the photosensitive composition of a nonimaged board did not strip even after 30 min in the developer solution under the same conditions. This experiment demonstrates that unexposed areas of the photosensitive composition can be removed (or further imaged) by additional exposures following the primary development.

A second sample board which was exposed imagewise for 1 min and developed for 2.5 min was baked in a circulating air oven for 30 min at 110° and then immersed in a ferric chloride etching bath at room temperature. After 20 min, the copper was etched away in the imaged areas of the board without lifting or undercutting the unexposed areas of the resist. Etch resistance was less satisfactory during etching at 50° (8 min).

EXAMPLE 11

A coating solution of the photosensitive composition was prepared as follows:
 7.2 g of a 28/72 styrene/butadiene linear ABA block copolymer (Kraton ®1102)
 1.5 g of mercaptopropionic acid
 1.2 g of oleic acid
 0.48 g of benzil dimethyl ketal
 0.02 g of 4-methyl-2,6-di-t-butylphenol
 0.022 g of benzotriazole
 65 g of 95.4/4.6 methylene chloride/methanol solvent.

The solution was coated onto a freshly pumiced, blank copper laminate board to give, after drying, an odorous, slightly tacky film. A polypropylene cover sheet was applied to the coating, and samples of the board were exposed imagewise for 1 to 6 min through the cover sheet as described in Example 1. After exposure, the boards were developed for 1.5 min at 32° in a solution of 0.8 percent sodium carbonate in 9/1 water/2-(2-butoxyethoxy)-ethanol with agitation by means of a magnetic stirrer. Images corresponding to the transparent areas of the process transparency were delineated on the board for all the exposures tested. The material in the exposed areas swelled in the developer solution, but it had insufficient solubility to be washed away to the board.

Another sample of the coated board was first baked in an air oven for 15 min at 70° and then it was exposed for 6 min. When the cover sheet was removed rapidly, the photosensitive composition in the unexposed regions was lifted from the board with the cover sheet and the film in the exposed regions remained on the board. Thus, it can be seen that the compositions and elements of this invention, normally employed to give a positive-working image by solvent washout of the exposed regions, can be also utilized as in the described peel-apart development process, to give a negative-working image.

EXAMPLE 12

A coating solution of the photosensitive composition was prepared as follows:
 10.0 g of Hycar ®1072-CG, premilled (20X passes) on a cold mill to improve solubility
 1.42 g of mercaptosuccinic acid
 1.32 g of ethylene glycol dicaprylate
 0.54 g of benzil dimethyl ketal
 0.02 g of 4-methyl-2,6-di-t-butylphenol
 0.03 g of benzotriazole
 106.64 g of 90/10 methylene chloride/methanol solvent.

Hycar ®1072-CG (B. F. Goodrich Co.) is a high molecular weight (average Mooney Viscosity=45:$M_n$ approximately 31,000) carboxylated butadiene/acrylonitrile copolymer (approximately 27% acrylonitrile content; carboxyl content approximately 3.38% based on equivalents per hundred parts of rubber (EPHR) value of 0.075).

The solution was coated onto a freshly pumiced, blank copper laminate board to give, after drying, a hazy film. A polypropylene cover sheet was applied to the coating, and samples of the board were exposed imagewise for 1 to 10 min through the cover sheet as described in Example 1. After exposure, the boards were developed at 32° in a solution of 0.8 percent sodium carbonate in 9/1 water/2-(2-butoxyethoxy)ethanol with agitation by means of a magnetic stirrer. Images corresponding to the transparent areas of the process transparency were delineated on the board for all the exposure times tested. Because of poor adhesion, the unexposed areas of the composition were lifted from the board after 1 min in the developer solution.

EXAMPLE 13

A solution was prepared by addition of 1.0 g of copolymer B, 0.1 g of mercaptosuccinic acid, 0.075 g of benzil dimethyl ketal, 0.1 g of ethylene glycol dicapryetching bath for 20 to 30 min at room temperature. The exposed image pattern was sharply etched to the laminate board backing without affecting the unexposed photoresist of the underlying copper.

EXAMPLE 3

A coating solution of the photosensitive composition was prepared as follows:
 1.00 g of copolymer M
 0.150 g of mercaptosuccinic acid
 0.143 g of ethylene glycol dicaprylate
 0.027 g of benzil dimethyl ketal
 0.002 g of 4-methyl-2,6-di-t-butylphenol
 0.003 g of benzotriazole
 5.300 g of 90/10 methylene chloride/methanol solvent.

The solution was coated onto a freshly pumiced blank copper laminate board with a 5-mil (125-μm) doctor knife. The coated board was dried and portions of the board were exposed through a process transparency as described in Example 1. After exposure, the boards were developed for varying times at 30° to 35° in a solution of 0.8 percent sodium carbonate in 9/1 water/2-(2-butoxyethoxy)ethanol with agitation by means of a magnetic stirrer. The results are summarized in Table 3.

TABLE 3

| Exposure Time, min | Development Time, min | Image Quality |
|---|---|---|
| 1 | 5 | Partially developed |
| 2 | 7 | Partially developed |
| 6 | 2 | Completely developed, sharp image |
| 10 | 2 | Completely developed, sharp image |

EXAMPLE 4

A coating solution of the photosensitive composition was prepared as follows:
 1.00 g of copolymer F
 0.100 g of mercaptosuccinic acid
 0.166 g of ethylene glycol dicaprylate
 0.054 g of benzil dimethyl ketal
 0.002 g of 4-methyl-2,6-di-t-butylphenol
 0.003 g of benzotriazole
 5.300 g of 90/10 methylene chloride/methanol solvent.

The solution was coated onto a freshly pumiced, blank copper laminate board with a 5-mil (125-μm) doctor knife. The dried film was clear, slightly tacky and had a thickness of approximately 25 μm. A clear 25-μm polypropylene cover sheet was applied to the coating to prevent its sticking to the process transparency during exposure. The cover sheet was smoothed onto the coating by means of a rubber squeegie, and it was removed after exposure without damage to the coating. Samples of the coated board were exposed imagewise through the cover sheet as described in Example 1. After exposure, the boards were developed for varying times at 32° in a solution of 0.8 percent sodium carbonate in 9/1 water/2-(2-butoxyethoxy)ethanol with agitation by means of a magnetic stirrer. The results are summarized in Table 4.

TABLE 4

| Exposure Time, min | Development Time, min | Image Quality |
|---|---|---|
| 0.17 | 3.0 | Partially developed |
| 0.33 | 2.5 | Completely developed, sharp image |
| 0.50 | 1.5 | Completely developed, sharp image |
| 1.0 | 1.0 | Completely developed, sharp image |

The coated boards showed excellent resolution capability. Comparable results were obtained when the coated boards were baked at 70° for 30 min in a circulating air oven before exposure.

Samples of the coated board were also exposed through the cover sheet in the vacuum frame at atmospheric pressure. Exposure/development times required to obtain a completely developed, sharp image were similar to those required for the boards exposed in vacuo.

EXAMPLES 5 TO 9

Coating solutions of five photosensitive compositions were prepared using 5.00 g of a different unsaturated copolymer in each solution and varying amounts of mercaptosuccinic acid and ethylene glycol dicaprylate as shown in Table 5.

TABLE 5

| Example | Copolymer | Mercapto-succinic Acid, g | Ethylene Glycol Dicaprylate, g |
|---|---|---|---|
| 5 | F | 0.500 | 0.870 |
| 6 | D | 0.670 | 0.700 |
| 7 | L | 1.340 | 0.030 |
| 8 | B | 1.340 | 0.030 |
| 9 | C | 0.710 | 0.660 |

Each coating solution contained 0.270 g of benzil dimethyl ketal, 0.010 g of 4-methyl-2,6-di-t-butylphenol, 0.015 g of benzotriazole, and 26.66 g of 90/10 methylene chloride/methanol solvent. The solutions of Examples 5 and 9 were clear, but those of Examples 6, 7, and 8 were slightly hazy and they were filtered before use. The solutions were coated onto freshly pumiced, blank copper laminate boards with a 7-mil (180-μm) doctor knife, and the boards were dried. Polypropylene cover sheets were applied to the coatings, and samples of the boards were exposed imagewise through the cover sheet as described in Example 1. After exposure, the boards were developed for varying times at 32° in a solution of 0.8 percent sodium carbonate in 9/1 water/2-(2-butoxyethoxy)-ethanol with agitation by means of a magnetic stirrer. Sharp, completely developed images were obtained under the exposure and development conditions summarized in Table 6.

TABLE 6

| Example | Exposure Time, min | Development Time, min |
|---|---|---|
| 5 | 1.0 | 1.5 |
| 6 | 6.0 | 8.0 |
| 7 | 2.0 | 4.3 |
| 8 | 1.0 | 2.5 | late, and 50 μL of a solution of additives to 4.3 ml of a methylene chloride/methanol (9:1) solvent mixture. The solution of additives consisted of a mixture of 3 mg of benzotriazole, 2 mg of 2,6-di-tert-butyl-4-methylphenol, and 2 mg of C.I. Solvent Red Dye #109 dissolved in the methylene chloride/methanol solvent mixture. The resulting clear solution was coated onto a pumiced copper substrate with an 8-mil (200-μm) doctor knife. The coated panel was dried overnight at room temperature.

A polypropylene cover sheet was placed over the panel, and it was exposed through a $\sqrt{2}$ step wedge process transparency in a vacuum printing frame (nuArc Co.) to radiation from a metal halide lamp covering the 3600 to 4500 Å spectral range at a distance of 38 cm for a time which corresponds to a radiation dosage of 100 units and an integrated light intensity of 580 mj/cm$^2$ incident on the exposed surface of the transparency. The cover sheet was removed, and the exposed panel was developed in a solution prepared from 2588 ml of water, 27 g of sodium carbonate, and 300 g of 2-(2-butoxyethoxy)-ethanol. A magnetic stirrer was used for agitation. After 2 min at 35°, development of the exposed portion of the panel to step 7 (32 mj/cm$^2$) was complete down to the copper surface. Areas of the coating exposed to less radiation remained intact.

EXAMPLE 14

A mixture of 1.0 g of copolymer C, 200 mg of 4-mercaptomethylbenzoic acid, 100 mg of benzil dimethyl ketal, 75 mg of ethylene glycol dicaprylate and 50 μL of the additive solution of Example 13 was dissolved in 4.3 ml of a 9:1 methylene chloride/methanol solvent mixture. The solution was coated onto a pumiced copper substrate with an 8-mil (200-μm) doctor knife. A polypropylene cover sheet was placed over the panel, and it was exposed through a $\sqrt{2}$ step wedge process transparency in the the vacuum printing frame of Example 13 to a radiation dosage of 100 units. The cover sheet was removed, and the exposed panel was developed for 4 minutes at 35° in the developer solution of Example 13. Development to step 4 (132 mj/cm$^2$) was complete down to the copper surface. Exposed copper was etched from the plate in a ferric chloride bath at room temperature. The etched plate was subsequently reexposed through a process transparency to an additional 290 mg/cm$^2$ of radiation, and the reexposed plate was developed for 4 minutes as described. Development of the second exposed area was complete down to the copper surface.

This Example demonstrates that the photosensitive element has add-on capability since the unexposed composition is still functional after the development and etching steps.

EXAMPLES 15 to 54

These Examples were carried out using the procedure described in Example 13. In each instance, a solution was prepared by addition of 1.0 g of a designated copolymer, a mercapto acid, a photoinitiator, a designated amount of ethylene glycol dicaprylate plasticizer, and 50 μL of the additive package to 4.3 ml of a 9/1 methylene chloride/methanol solvent mixture. The resulting solution was coated onto a substrate using a doctor knife to give the designated initial coating thickness. Substrates employed were either pumiced copper (Cu), or an oriented polyester film or polypropylene film (Film). When a film was employed, the coating was transferred to a copper substrate by lamination before exposure. Dried coatings were exposed to radiation as described for a time which corresponds to the number of units required to give the designated integrated light intensity (mj/cm$^2$). The exposed coatings were developed at 35° for the designated time. In most of the Examples, the resulting image resolution was measured in μm. The developed images were examined and the development class noted, as follows:

C- cleared during development down to the copper substrate,
S- the image was nearly cleared,
R- relief image was obtained but it was not cleared down to the copper base,
V- a visible image was obtained but no relief was noted.

A summary of these Examples is contained in Tables 7 and 8. In Table 7, the mercapto acids and radical-generating initiators are referred to by leter designations according to the following key:

| Mercapto acids | |
| --- | --- |
| a | 6-mercaptocaproic acid |
| b | mercaptosuccinic acid |
| c | mercaptoitaconic acid |
| d | 2-mercaptocaproic acid |
| e | 4-mercaptomethylbenzoic acid |
| f | 4-mercaptomethyldihydrocinnamic acid |
| g | mercaptosuccinic acid, mono-methyl ester |
| h | mercaptosuccinic acid, mono-n-hexyl ester |
| i | mercaptosuccinic acid, mono-2-ethoxyethyl ester |
| j | N—acetylcysteine |
| k | 11-mercaptoundecanoic acid. |

| Initiators | |
| --- | --- |
| aa | benzil dimethyl ketal |
| bb | benzoin methyl ether |
| cc | 2-(o-chlorophenyl)-4,5-diphenylimidazolyl dimer |
| dd | methylbenzoin methyl ether |
| ee | methylbenzoin |
| ff | benzophenone |
| gg | pentylanthraquinone |
| hh | 4/1 benzophenone/Michler's ketone |
| ii | benzoin ethyl ether |
| jj | desoxybenzoin |
| kk | 1/1 benzophenone/Michler's ketone |
| ll | 4-phenylbenzophenone |
| mm | benzoin isobutyl ether |
| nn | Michler's ketone. |

TABLE 7

| Example | Co-polymer | Mercapto Acid, mg | Plasticizer, mg | Initiator mg | Coating Thickness μm |
| --- | --- | --- | --- | --- | --- |
| 15 | C | a/100 | 0 | aa/200 | 200 |
| 16 | C | b/140 | 130 | aa/55 | 200 |
| 17 | B | a/100 | 50 | bb/100 | 200 |
| 18 | K | b/100 | 50 | aa/100 | 100 |
| 19 | C | b/100 | 75 | aa/100 | 100 |
| 20 | N | c/100 | 50 | aa/100 | 100 |
| 21 | D | a/100 | 0 | aa/200 | 200 |
| 22 | E | b/100 | 50 | aa/100 | 100 |
| 23 | C | d/200 | 75 | aa/100 | 200 |
| 24 | C | e/100 | 50 | aa/100 | 200 |
| 25 | B | d/150 | 0 | cc/50 | 200 |
| 26 | K | b/100 | 50 | dd/100 | 100 |
| 27 | K | b/100 | 50 | ee/100 | 100 |
| 28 | C | b/100 | 50 | ff/100 | 200 |
| 29 | O | b/100 | 175 | aa/110 | 200 |
| 30 | A | a/100 | 50 | aa/100 | 200 |
| 31 | G | f/200 | 100 | aa/100 | 200 |
| 32 | C | b/100 | 100 | gg/100 | 200 |

TABLE 7-continued

| Example | Co-polymer | Mercapto Acid, mg | Plasticizer, mg | Initiator mg | Coating Thickness μm |
|---|---|---|---|---|---|
| 33 | B | b/100 | 50 | hh/100 | 100 |
| 34 | C | d/200 | 0 | ff/100 | 200 |
| 35 | K | b/100 | 50 | ii/100 | 100 |
| 36 | C | b/100 | 100 | jj/100 | 200 |
| 37 | K | g/100 | 50 | bb/100 | 200 |
| 38 | B | b/100 | 50 | kk/100 | 100 |
| 39 | C | b/100 | 100 | ll/100 | 200 |
| 40 | H | b/100 | 50 | aa/100 | 200 |
| 41 | G | h/200 | 0 | aa/100 | 200 |
| 42 | L | b/100 | 50 | mm/100 | 100 |
| 43 | A | b/100 | 50 | ff/100 | 200 |
| 44 | A | b/100 | 50 | nn/100 | 200 |
| 45 | G | i/100 | 0 | aa/100 | 200 |
| 46 | I | b/100 | 50 | aa/100 | 100 |
| 47 | J | b/100 | 50 | aa/100 | 100 |
| 48 | A | j/100 | 50 | aa/100 | 200 |
| 49 | G | g/102 | 50 | aa/100 | 200 |
| 50 | K | k/200 | 100 | aa/200 | 100 |
| 51 | N | k/200 | 100 | aa/50 | 100 |
| 52 | (1) | (2)/100 | 50 | aa/100 | 100 |
| 53 | N | k/200 | 0 | aa/200 | 100 |
| 54 | P | b/100 | 50 | aa/100 | 100 |

(1) a 1/1 mixture of copolymers K + N was used.
(2) a 1/1 mixture of mercapto acids b + k was used.

TABLE 8

| Example | Laminate | Exposure mj/cm$^2$ | Development Time min | Resolution μm | Class |
|---|---|---|---|---|---|
| 15 | Cu | 3 | 2 | 76 | C |
| 16 | Cu | 8 | 1 | 130 | C |
| 17 | Film | 5 | 2 | 130 | C |
| 18 | Film | 1 | 2 | 25 | C |
| 19 | Cu | 2 | 2 | — | C |
| 20 | Film | 3 | 2 | — | C |
| 21 | Cu | 4 | 2 | 200 | C |
| 22 | Cu | 32 | 2 | — | C |
| 23 | Cu | 23 | 2 | 130 | C |
| 24 | Film | 32 | 3 | 76 | C |
| 25 | Cu | 32 | 3 | 25 | C |
| 26 | Film | 8 | 2 | 51 | S |
| 27 | Film | 16 | 2 | 100 | C |
| 28 | Film | 45 | 2 | 130 | C |
| 29 | Film | 22 | 2 | 76 | C |
| 30 | Film | 45 | 8 | 76 | C |
| 31 | Cu | 15 | 6 | 150 | S-C |
| 32 | Cu | 62 | 2 | 51 | C |
| 33 | Film | 132 | 5 | 25 | C |
| 34 | Cu | 250 | 2 | 51 | C |
| 35 | Film | 32 | 2 | 25 | C |
| 36 | Cu | 132 | 2 | 100 | C |
| 37 | Film | 87 | 2 | 51 | C |
| 38 | Film | 580 | 2 | — | S |
| 39 | Cu | 580 | 2 | 130 | C |
| 40 | Cu | 1160 | 6 | 76 | C |
| 41 | Cu | 265 | 8 | — | R |
| 42 | Film | 252 | 8 | 76 | S-C |
| 43 | Cu | 580 | 4 | 25 | C |
| 44 | Cu | 580 | 8 | — | R |
| 45 | Cu | 175 | 8 | — | V |
| 46 | Cu | 580 | 16 | — | R |
| 47 | Cu | 580 | 16 | 76 | V |
| 48 | Cu | 580 | 8 | — | V |
| 49 | Cu | 580 | 8 | — | V |
| 50 | Cu | 1 | 1 | 51 | C |
| 51 | Cu | 1 | 2 | 51 | C |
| 52 | Cu | 3 | 2 | 25 | C |
| 53 | Cu | 1 | 1 | 100 | C |
| 54 | Cu | 580 | 16 | — | C |

EXAMPLE 55

PREPARATION OF A POSITIVE-WORKING LITHO FILM

Two solutions were prepared.

A 20 g carbon black
120 ml methylene chloride

B 1 g of copolymer K
0.20 g of 11-mercaptoundecanoic acid
0.20 g of benzil dimethyl ketal
4.3 ml of 90/10 methylene chloride/methanol solvent Solution A was filtered under pressure through a 10-μm millipore filter, and the filtrate was coated with a 4-mil (100-μm) doctor knife onto a 5-mil (125-μm) gelatin-coated oriented polyester film substrate. The coated film was dried, and it had a transmittance of 5.70. Solution B was coated with the same doctor knife onto the Solution A-coated substrate.

The coated film was exposed through a $\sqrt{2}$ step wedge and a silver negative with a transmittance of 0.4 percent in the vacuum printing frame of Example 13 to a radiation dosage of 67 units. The exposed film was developed for 2 min at 35° with a solution of 0.8 percent sodium carbonate in 9/1 water/2-(2-butoxyethoxy)ethanol in a spray developer. The last step washed off corresponds to an energy of 0.13 mj/cm$^2$ at the surface of the film.

EXAMPLES 56 TO 62

These Examples were carried out using the procedure described in Example 13 and Examples 15 to 54. No additional plasticizer was used. A coating thickness of 200 μm was employed in each Example. An oriented polyester or polypropylene film substrate was used. A summary of these Examples is contained in Tables 9 and 10. In Table 9, the mercapto acid and radical-generating initiators not listed in earlier Examples are referred to by letter designations according to the following key:

Mercapto acids
   l  5-mercaptopentanephosphonic acid
   m  2-mercaptohexadecanoic acid Initiators
   oo  4-methyl-4-trichloromethyl-2,5-cyclohexadienone (TMCH).

TABLE 9

| Example | Copolymer | Mercapto Acid/mg | Initiator/mg |
|---|---|---|---|
| 56 | L | k/150 | 85:4:11 ff:oo:nn/237 |
| 57 | L | k/150 | 86:7:7 ff:oo:nn/230 |
| 58 | L | k/250 | 86:7:7 ff:oo:nn/115 |
| 59 | L | k/150 | 78:11:11 ff:oo:nn/260 |
| 60 | Q + R(1) | l/200 | aa/200 |
| 61 | Q + R(1) | l/150 | aa/150 |
| 62 | S | m/150 | aa/150 |

(1) a 1/1 mixture was used.

TABLE 10

| Example | Exposure mj/cm$^2$ | Development Time, min | Resolution μm | Class |
|---|---|---|---|---|
| 56 | 2 | 1 | 305 | C |
| 57 | 4 | 2 | 51 | C |

TABLE 10-continued

| Example | Exposure mj/cm² | Development Time, min | Resolution μm | Class |
|---|---|---|---|---|
| 58 | 2 | 2 | 100 | C |
| 59 | 2 | 2 | 200 | C |
| 60 | 11 | 2 | 255 | C |
| 61 | 24 | 2 | 400 | C |
| 62 | 175 | 4 | 76 | C |

I claim: The embodiments of the invention in which an exclusive property or privilege is claimed are defined as follows:

1. A positive-working, monomer-free photosensitive composition comprising the following components:
   (i) about 10 to 90 percent by total weight of components (i), (ii), and (iii), of a polyene having a number average molecular weight of about 1,000 to 1,000,000, said polyene containing about 20 to 1800 milliequivalents of reactive unsaturated carbon to carbon groups per 100 g of polyene;
   (ii) about 1 to 70 percent by total weight of components (i), (ii), and (iii), of a reactive mercapto acid; and
   (iii) about 0.001 to 50 percent by total weight of components (i), (ii), and (iii) of a radiation-sensitive, radical-generating system, activatable by actinic radiation to initiate addition of the mercapto acid to the polyene.

2. A composition according to claim 1 wherein the polyene is present at about 40 to 80 percent by total weight of components (i), (ii) and (iii).

3. A composition according to claim 2 wherein the polyene contains at least one group selected from

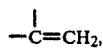

—CH=CH—, and —CH=CH₂.

4. A composition according to claim 3 containing such group in the alkyl portion of a substituted alkyl methacrylate copolymer.

5. A composition according to claim 4 wherein the polyene is selected from copolymers of methyl methacrylate and allyl methacrylate or undecenyl methacrylate, and terpolymers of methyl methacrylate, butyl methacrylate and allyl methacrylate.

6. A composition according to any one of claims 1, 2, 3, 4 or 5 wherein the molecular weight of the polyene is about 5,000 to 100,000 and there are about 50 to 1,000 milliequivalents of reactive unsaturated carbon to carbon groups per 100 grams of polyene.

7. A composition according to claim 1 wherein the mercapto acid is present in an amount of about 5 to 40 percent by total weight of components (i), (ii) and (iii).

8. A composition according to claim 7 wherein the mercapto acid is a mercaptocarboxylic acid.

9. A composition according to any one of claims 1, 7 or 8 wherein the mercapto acid has the structure

HS-R-CO₂H wherein R is alkylene of 1 to 18 carbons, unsubstituted or substituted with carboxyl or alkoxycarbonyl groups.

10. A composition according to claim 1 wherein the radical-generating system is present in an amount of about 1 to 20 percent by total weight of components (i), (ii) and (iii).

11. A composition according to claim 1 or 10 wherein the radical-generating system comprises a benzoin ether.

12. A composition according to claim 6 wherein the mercapto acid has the structure

HS-R-CO₂H wherein R is alkylene of 1 to 18 carbons, unsubstituted or substituted with carboxyl or alkoxycarbonyl groups, and the radical-generating system comprises a benzoin ether.

13. A composition according to claim 5 wherein the mercapto acid is 11-mercaptoundecanoic acid and the radical-generating system is the compound, benzil dimethyl ketal.

14. A composition according to claim 5 wherein the radical-generating system comprises 4-methyl-4-trichloromethyl-2,5-cyclohexadienone.

15. A composition according to claim 14 where the mercapto acid is 11-mercaptoundecanoic acid.

16. A composition according to one of claims 13, 14 or 15 wherein the polyene is a copolymer of methyl methacrylate and undecenyl methacrylate.

17. A composition according to one of claims 13, 14 or 15 wherein the polyene is a terpolymer of methyl methacrylate, butyl methacrylate and allyl methacrylate.

18. A photosensitive element comprising a substrate coated with the photosensitive composition of claim 1.

19. A photosensitive element comprising a substrate coated with the photosensitive composition of claim 13.

20. A photosensitive element comprising a substrate coated with the photosensitive composition of claim 14.

21. A photosensitive element according to claim 18 wherein the substrate is copper.

22. A photosensitive element according to claim 19 wherein the substrate is copper.

23. A photosensitive element according to claim 20 wherein the substrate is copper.

24. A method of photoimaging comprising imagewise exposing the photosensitive element of claim 18 to actinic radiation, and developing the image.

25. A method of photoimaging comprising imagewise exposing the photosensitive element of claim 19 to actinic radiation, and developing the image.

26. A method of photoimaging comprising imagewise exposing the photosensitive element of claim 20 to actinic radiation, and developing the image.

27. A method according to any one of claims 24, 25 or 26 wherein the substrate is copper.

* * * * *